United States Patent [19]
Barth et al.

[11] Patent Number: 4,551,673
[45] Date of Patent: Nov. 5, 1985

[54] TESTING ARRANGEMENT FOR PRINTED CIRCUIT BOARDS

[75] Inventors: Hans Barth, Schallstadt; Manfred Prokopp, Wertheim-Waldenhausen, both of Fed. Rep. of Germany

[73] Assignee: Riba-Prüftechnik GmbH, Schallstadt-Wolfenweiler, Fed. Rep. of Germany

[21] Appl. No.: 307,026

[22] Filed: Sep. 30, 1981

[30] Foreign Application Priority Data

Oct. 13, 1980 [DE] Fed. Rep. of Germany ....... 3038665

[51] Int. Cl.[4] ............................................ G01R 31/02
[52] U.S. Cl. ............................ 324/158 F; 324/73 PC; 324/158 P
[58] Field of Search .......... 324/158 F, 73 PC, 73 AT, 324/158 P, 72.5

[56] References Cited

U.S. PATENT DOCUMENTS

| | | | |
|---|---|---|---|
| 3,584,300 | 6/1971 | Schulz | 324/158 F |
| 3,654,585 | 4/1972 | Wickersham | 324/158 F |
| 4,099,120 | 7/1978 | Aksu | 324/158 F |
| 4,352,061 | 9/1982 | Matrone | 324/158 F |

FOREIGN PATENT DOCUMENTS

| | | |
|---|---|---|
| 0026824 | 4/1981 | European Pat. Off. . |
| 0500913 | 5/1982 | European Pat. Off. . |
| 2051052 | 10/1970 | Fed. Rep. of Germany . |
| 2707900 | 2/1977 | Fed. Rep. of Germany . |
| 1514060 | 6/1978 | United Kingdom . |
| 2061630 | 5/1981 | United Kingdom . |

OTHER PUBLICATIONS

Renz, U.; "Test Probe ... "; IBM Tech. Dis. Bull.; vol. 21; No. 8; Jan., 1979; pp. 3235-3236.
Marshall et al.; "Multicontact ... ; Western Electric Tech. Dig., No. 20; Oct. 1970; pp. 49-50.
ATG Electronic Pub.; "Universelles Leiterplatten--Prufsystem"; pp. 1-8; Automatische Test-Gerate GmbH, Schallstadt, Fed. Rep., Germany.

Primary Examiner—Ernest F. Karlsen
Attorney, Agent, or Firm—Peter K. Kontler

[57] ABSTRACT

A testing arrangement for a printed circuit board includes a carrier for a multiplicity of contact pins which engage the ends of the printed conductors on the printed circuit board. The carrier is positioned above a base which receives a multiplicity of leads connected with a device for testing the printed circuit board. The leads, which are to be connected with respective ones of the contact pins, engage sockets mounted in the base. The connections between the contact pins and the leads are established via a sheet which is located intermediate the base and the carrier and is provided with contacts in the form of thin foils. The contacts face and engage respective ones of the contact pins. The contacts are connected with plugs which are mounted on the intermediate sheet and are inserted into the sockets in the base. The intermediate sheet is exchangeable and may be replaced either with a sheet having a different pattern of contacts when a new type of printed circuit board is to be tested or with an identical sheet when the contacts on the original sheet become worn. Replacement of the intermediate sheet may be accomplished without disturbing the complicated arrangement of leads to the testing device.

52 Claims, 5 Drawing Figures

TESTING ARRANGEMENT FOR PRINTED CIRCUIT BOARDS

BACKGROUND OF THE INVENTION

The invention relates generally to printed circuit boards.

More particularly, the invention relates to a testing arrangement for printed circuit boards.

Printed circuit boards are provided with printed conductors or circuits. A known arrangement for testing the continuity of the printed conductors has contact pins which respectively engage the ends of the printed conductors during testing. One end of each contact pin engages an end of a printed conductor while the other end of each contact pin constitutes a contact for an electrical conductor connected with a testing or measuring device. The contact pins are mounted in a carrier and are advantageously arranged on a grid. Preferably, the positions of the contact pins correspond to those of the ends of the printed conductors.

A testing arrangement of this type may, for example, have a grid of 2,000 to 20,000 locations at which contact is to be established with a printed circuit board undergoing test. It is possible to provide contact pins only at those locations of the grid where the printed circuit board is to be contacted or at all locations of the grid. In the latter case, those contact pins which are not to contact the printed circuit board can be covered with a perforate foil serving as a mask.

Testing arrangements having contact pins only at those locations where the printed circuit board is to be contacted have the disadvantage that their use is restricted to the particular series of printed circuit boards for which they were designed. This results in relatively high costs, especially for a limited run of a particular type of printed circuit board. On the other hand, testing arrangements in which contact pins are provided at all locations of a grid are difficult to construct and of high cost. This is due mainly to the fact that all locations of the grid are provided with contact pins. Furthermore, both types of testing arrangements have the disadvantage that only those locations of a printed circuit board which lie within the area of the grid and at the intersections of the grid lines can be contacted.

OBJECTS AND SUMMARY OF THE INVENTION

It is an object of the invention to provide a testing arrangement for printed circuit boards which is low-cost yet has the versatility to test printed circuit boards of different types.

Another object of the invention is to provide a testing arrangement for printed circuit boards which makes it possible to contact locations of a printed circuit board situated outside of the area of a grid of contact members or pins which are to contact the printed circuit board.

An additional object of the invention is to provide a testing arrangement for printed circuit boards which makes it possible to contact locations of a printed circuit board which are not situated at the intersections of the grid lines of a grid of contact members or pins which are to contact the printed circuit board.

It is also an object of the invention to provide a testing arrangement for printed circuit boards which may be easily adapted to different types of printed circuit boards.

Another object of the invention is to provide a testing arrangement for printed circuit boards which may be rapidly adapted to different types of printed circuit boards.

A concomitant object of the invention is to provide a testing arrangement for printed circuit boards which may be adapted to different types of printed circuit boards at low cost.

These objects, and others which will become apparent as the description proceeds, are achieved by the invention.

An arrangement according to the invention for use in testing a printed circuit board having printed conductors comprises a plurality of contact pins or members for establishing electrical communication with the printed conductors. A corresponding plurality of leads is provided for establishing electrical communication with a testing or measuring device for the printed circuit board. The arrangement further includes removable support means located between the leads and the contact pins and having a plurality of contacts for establishing electrical connections between the respective leads and contact pins. The support means arranged intermediate the leads and the contact pins is advantageously in the form of a sheet.

In contrast to conventional testing arrangements, the intermediate sheet of the invention makes it possible to have available various patterns of contacts for the contact pins and to rapidly convert from one of these patterns to another. On the one hand, this makes it unnecessary to change the arrangement of leads to the electrical testing device for the printed circuit boards when the pattern of contacts is changed to permit testing of a different type of printed circuit board. This is a considerable advantage since the arrangement of leads is quite complicated due to the large number of leads involved. On the other hand, it is possible to adapt to different types of printed circuit boards simply by changing the intermediate sheet. Furthermore, since the intermediate sheet is removable, it may be replaced at low cost when it becomes worn.

Generally, the printed conductors of a printed circuit board have ends which are respectively engaged by one end of a contact pin during testing. The other or connecting end of each contact pin is connected with the terminal end of a respective lead to the testing device, that is, the end of the respective lead remote from the testing device. In accordance with the invention, the intermediate sheet is arranged between the terminal ends of the leads and the connecting ends of the contact pins and the connections between the terminal ends of the leads and the connecting ends of the contact pins are established via the contacts provided on the intermediate sheet. A preferred embodiment of the invention contemplates for the contacts to be in the form of thin foils or laminae.

The terminal ends of the leads are advantageously mounted in a base plate in such a manner that they are located in a common plane. The base plate favorably has a grid or, in other words, is constructed so that the locations at which the terminal ends of the leads are received form a grid. Here, the leads are connected with the contacts of the intermediate plate via plug-in connections. These plug-in connections permit the intermediate plate to be readily exchanged. The plug-in connections simultaneously constitute holding devices for the intermediate plate.

According to another advantageous embodiment of the invention, the intermediate sheet is divided into sections which may be removed and replaced independently of one another. This makes it possible to individually provide different areas of the base plate with intermediate sheet sections having patterns of contacts conforming to those locations of the corresponding areas of the printed circuit board which are to be contacted. Furthermore, it is not necessary to replace the entire intermediate sheet when a section becomes worn since this section may be replaced independently of the remaining sections of the intermediate sheet.

According to an additional embodiment of the invention, the intermediate sheet has contacts which are arranged in a grid corresponding to that in the base plate and other contacts which are located outside of the grid. Electrical conductors, which are preferably in the form of printed conductors, connect the contacts outside of the grid with selected contacts inside the grid. This embodiment of the invention is useful when the printed circuit board is to be contacted at locations which lie outside of the area of the grid in the base plate. In this situation, contact pins corresponding to the contacts outside of the grid are provided. By arranging appropriate contacts outside of the grid and connecting these with contacts inside the grid, it becomes possible to establish communication between the contacts inside the grid and the contact pins located outside of the area of the grid.

The contact pins are preferably mounted in a plate-like carrier. In the last-described embodiment of the invention, the carrier advantageously projects beyond the area of the grid on at least one side of the latter and the projecting portion of the carrier is provided with appropriately positioned contact pins.

The carrier may be formed with mounting passages which accommodate the contact pins. It is favorable for the contact pins to be supported on abutment surfaces located in the region of the lower side of the carrier and to be received in the mounting passages with clearance so that they may be withdrawn in an upward direction. This enables contact pins to be selectively inserted in the carrier at positions corresponding to the locations of the printed circuit board to be contacted.

Another embodiment of the invention likewise makes it possible to contact locations of the printed circuit board which lie outside the area of the grid in the base plate. Here, the carrier is again designed so as to project beyond the area corresponding to the grid. Within the area of the grid, the carrier has long pins which extend from one side of the carrier to the other. The respective ends of each contact pin engage a location of the printed circuit board and a contact of the intermediate sheet inside the grid and are aligned in a direction from this location of the printed circuit board to the corresponding contact of the intermediate sheet. The carrier further has short contact pins within the area of the grid which project towards the intermediate sheet from the side of the carrier facing this sheet and engage respective contacts within the grid on the intermediate sheet. Additional short contact pins are arranged in the portion of the carrier which projects beyond the area of the grid and extend toward the printed circuit board from the side of the carrier facing the board. These pins engage locations of the printed circuit board which are situated outside of the area of the grid. The short pins outside of the area of the grid are electrically connected with respective short pins inside the area of the grid internally of the carrier. In contrast to the earlier-described embodiment of the invention for engaging locations of the printed circuit board outside of the area of the grid, the lateral shift from inside the area of the grid to outside the area of the grid is here effected within the carrier.

There may be occasions when the locations of the printed circuit board to be contacted lie within the area of the grid but are displaced relative to the intersections of the grid lines. This may require shifting of the corresponding contact pins in order to insure that these will engage the respective locations of the printed circuit board. In such an event, the areas of the contacts on the intermediate sheet are advantageously made sufficiently large to allow for shifting of the contact pins without disengagement of the latter from the corresponding contacts. Within certain limits, this enables locations of the printed circuit board which are displaced from the intersections of the grid lines to be contacted without altering the testing arrangement.

There may also be occasions where a location of the printed circuit board to be contacted lies so far from an intersection of the grid lines, e.g. exactly midway between two intersections, that a contact pin positioned to engage this location lies between two contacts of the intermediate sheet. For such situations, yet another embodiment of the invention provides for the carrier to be movable in its plane relative to the intermediate sheet and, if convenient, relative to the base plate. While it is true that this causes movement of all the contact pins relative to their corresponding contacts, the movement of those pins which already engage contacts may be confined to the areas of the respective contacts. On the other hand, the contact pin or pins positioned between the contacts of the intermediate sheet may be brought into engagement with the corresponding contacts.

The novel features which are considered as characteristic of the invention are set forth in particular in the appended claims. The improved testing arrangement itself, however, both as to its construction and its mode of operation, together with additional features and advantages thereof, will be best understood upon perusal of the following detailed description of certain specific embodiments with reference to the accompanying drawing.

DESCRIPTION OF THE PREFERRED EMBODIMENTS

Figure 1:
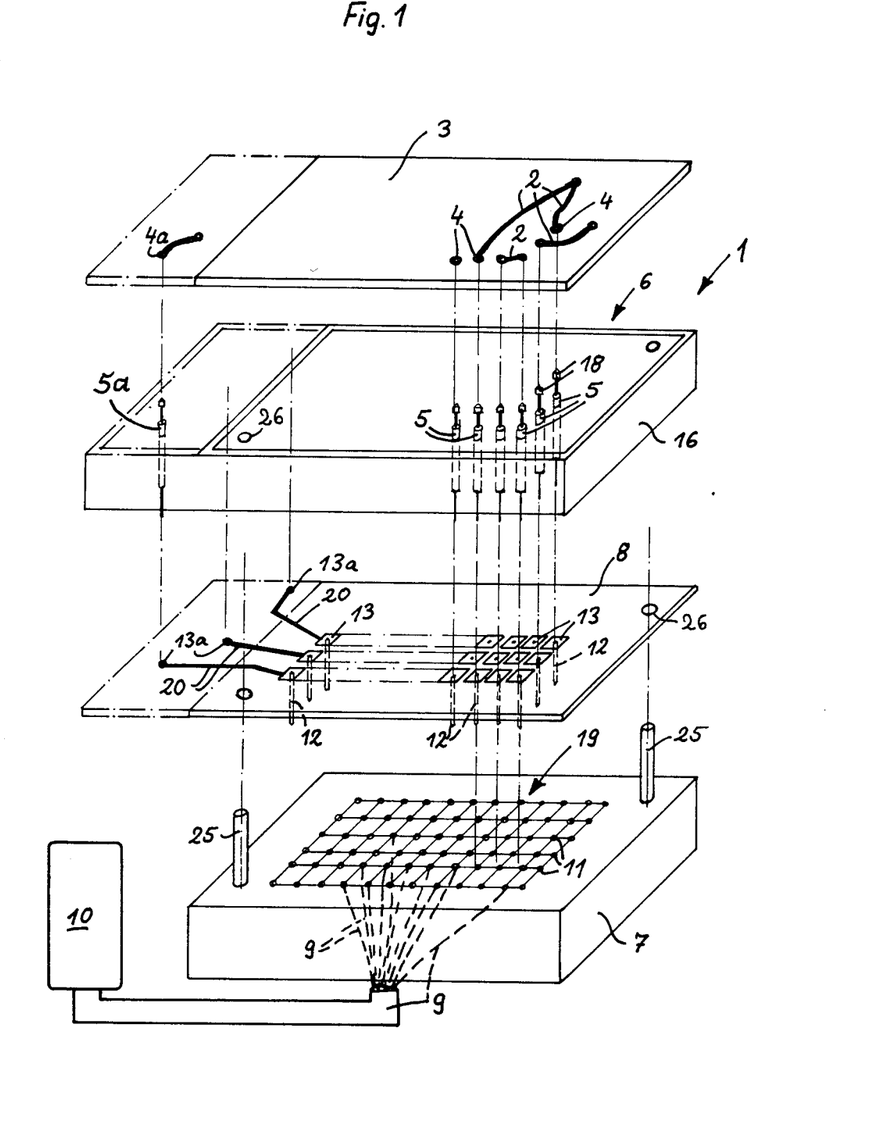
FIG. 1 is an exploded perspective view of a testing arrangement for printed circuit boards according to the invention showing different embodiments of an intermediate sheet.

Referring to FIG. 1, the reference numeral 1 generally identifies an arrangement according to the invention for testing a printed circuit board 3. The printed circuit board 3 is provided with printed circuits or conductors 2 having respective ends 4.

The testing arrangement 1 includes a plate-like carrier 6 which supports a series of contact pins or members 5. The positions of the contact pins 5 correspond to those of the ends 4 of the printed conductors 2. The contact pins 5 are provided with contact tips 18 which engage the ends 4 of the printed conductors 2 during testing of the printed circuit board 3.

The testing arrangement 1 further comprises an intermediate sheet or support 8 having contacts 13 on the surface thereof facing the carrier 6. The positions of the contacts 13 correspond to those of the contact pins 5. The ends of the contact pins 5 opposite the contact tips 18 project through the side of the carrier 6 facing the intermediate sheet 8 to enable the pins 5 to engage the contacts 13.

Figures 3, 4:
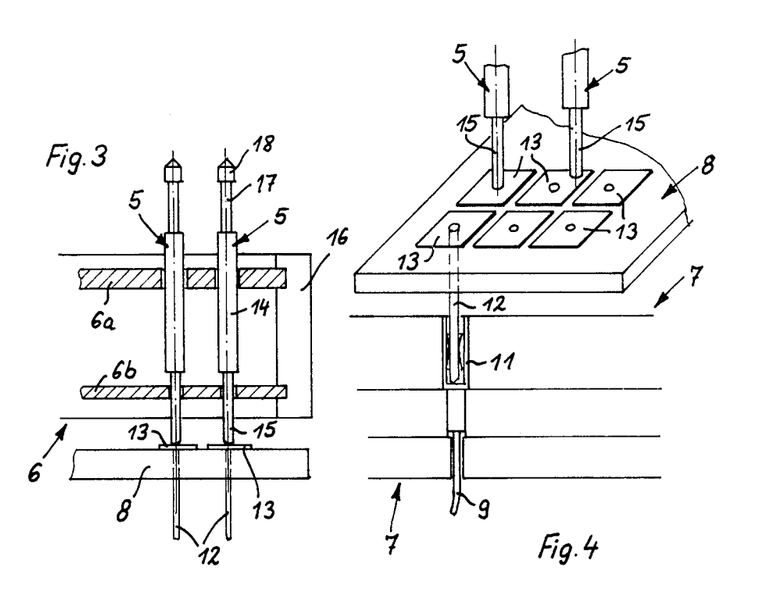
FIG. 3 is a partly cross-sectional view showing one embodiment of a contact pin carrier according to the invention.
FIG. 4 is a cross-sectional view of a base plate in accordance with the invention showing a connection between the base plate and an intermediate sheet of the invention.

The testing arrangement 1 also includes a base plate or base 7 which, as best seen in FIG. 4, has sockets or junctions 11 embedded therein. The positions of the sockets 11 correspond to those of the contacts 13 on the intermediate sheet 8. With reference again to FIG. 1, the sockets 11 are mounted in the base plate 7 so as to form a grid 19 and are located at the grid intersections, that is, at the intersections of the grid lines.

Referring to FIGS. 3 and 4 in conjunction with FIG. 1, it is seen that the intermediate sheet 8 has plugs or pins 12 which project from that side of the intermediate sheet 8 facing the base plate 7. The plugs 12 extend through the intermediate sheet 8 and each of the plugs 12 engages the center of a respective contact 13. The plugs 12 are received by respective ones of the sockets 11 as particularly clearly seen in FIG. 4. The sockets 11 and plugs 12 constitute plug-in connections which enable the intermediate sheet 8 to be plugged into and out of the base plate 7.

It will be apparent from the description thus far that the contacts 13 and plugs 12 of the intermediate sheet 8, as well as the pins 5 mounted in the carrier 6, are arranged on grids corresponding to the grid 19 formed by the sockets 11.

With reference to FIGS. 1 and 4, the sockets 11 are engaged by respective leads or electrical conductors 9 which extend into the base plate 7 from beneath the sockets 11. The leads 9 are connected with an electrical testing or measuring device 10 which checks the insulating values or continuity of the printed conductors 2 on the printed circuit board 3.

As best seen in FIG. 3, the carrier 6 is constituted by a frame 16 which supports two parallel insulating plates 6a and 6b. The carrier 6 is provided with mounting passages which accommodate the contact pins 5 and extend through the frame 16 and the plates 6a and 6b. The contact pins 5 are received in the mounting passages with clearance so as to permit movement of the contact pins 5 in axial direction thereof. The mounting passages of the carrier 6 serve mainly to prevent lateral movement of the contact pins 5 during testing of the printed circuit board 3.

As also shown in FIG. 3, each of the contact pins 5 includes a hollow body 14 which accommodates a non-illustrated spring. A plunger or telescoping member 17, which carries the contact tip 18 of the contact pin 5, extends into the hollow body 14 through the upper end of the latter and can be depressed into the hollow body 14 against the action of the spring. A contact peg 15 of smaller diameter than the hollow body 14 is secured to the lower end of the hollow body 14. A shoulder is thus formed at the junction between the hollow body 14 and the contact peg 15. This shoulder is located above the lower plate 6b of the carrier 6. In the showing of FIG. 3, the contact pegs 15 engage the contacts 13 of the intermediate sheet 8 and the shoulders of the contact pins 5 are located at a distance above the lower plate 6b of the carrier 6. When the carrier 6 is removed from the testing arrangement 1 and the contact pegs 15 are no longer supported by the contacts 13, the contact pins 5 drop until the shoulders rest on the lower plate 6b thereby preventing further downward movement of the contact pins 5. The contact pins 5 which, as indicated previously, are movably mounted in the carrier 6, may be removed from the latter via the upper ends of the mounting passages.

FIG. 1 is an exploded view of the testing arrangement 1. When the testing arrangement 1 is in use, the intermediate sheet 8 is plugged into the base plate 7 via the sockets 11 and plugs 12 which serve to connect the contacts 13 with the tesing device 10 and to hold the intermediate sheet 8 in position. The intermediate sheet 8 lies generally flat against the base plate 7. The carrier 6 is positioned parallel to the intermediate sheet 8 with the contact pegs 15 of the contact pins 5 resting on respective ones of the contacts 13. Advantageously, the frame 16 of the carrier 6 rests on the intermediate sheet 8. The printed circuit board 3 is placed atop the carrier 6 with the ends 4 of the printed conductors 2 contacting respective ones of the contact pins 5.

The base plate 7 is provided with guide pins 25 which fit into corresponding guide openings 26 in the carrier 6. The guide pins 25 and guide openings 26 insure that the base plate 7 and the carrier 6 are correctly positioned relative to one another. If necessary, the intermediate sheet 8 may also have guide openings 26 as illustrated to receive the pins 25.

The intermediate sheet 8 of the testing arrangement 1 makes it possible to convert the latter for the testing of different types of printed circuit boards without disturbing the arrangement of the leads 9 connected with the grid 19. In particular, the conversion may be accomplished without disengaging the leads 9 from the respective sockets 11. This provides a considerable simplification in view of the large number of the leads 9, e.g. 1,000 to 20,000. Another advantage of the intermediate sheet 8 resides in that it may be readily exchanged when worn. In such a case, also, the arrangement of the leads 9 need not be disturbed.

The number and positions of the contacts 13 of the intermediate sheet 8 may correspond to the number and positions of the printed conductor ends 4 on the particular printed circuit board 3 to be tested. On the other hand, it is possible to arrange the contacts 13 over the entire surface of the intermediate sheet 8 and to provide the carrier 6 with precisely those contact pins 5 required to contact the printed conductor ends 4 on the specific printed circuit board 3 being tested. In practice, insertion of the requisite contact pins 5 in the carrier 6 may be accomplished by an automatic pinsetting machine or with the aid of a template.

The intermediate sheet 8 of the invention provides an advantageous manner of engaging printed conductor ends which are located laterally of the area of the grid 19. Referring to FIG. 1, the reference numeral 4a identifies a representative one of several printed conductor ends which lie to one side of the grid 19. The carrier 6 has a projecting portion which extends beyond the grid 19 on the side of the latter where the printed conductor ends 4a are located. The projecting portion of the carrier 6 is provided with contact pins 5a which are identical to the contact pins 5 and are arranged to engage the printed conductor ends 4a. The intermediate sheet 8 also has a projecting portion which extends beyond the grid 19 on the side thereof where the printed conductor ends 4a are located. Contacts 13a for engaging the contact pins 5a are arranged on the projecting portion of the intermediate sheet 8. The contacts 13a are connected with respective ones of the contacts 13 within the area of the grid 19 by conducting strips 20. The conducting strips 20 are preferably in the form of printed conductors.

In the preceding embodiment of the invention, selected contacts 13 within the area of the grid 19 are connected with printed conductor ends 4a located outside of this area via the conducting strips 20 on the intermediate sheet 8. According to another embodiment of the invention, the connections between contacts 13 inside the area of the grid 19 and printed conductor ends 4a located outside of the area of the grid 19 are effected internally of the carrier 6. As before, the carrier 6 has a projecting portion which extends laterally of the grid 19 on the side of the latter where the printed conductor ends 4a are located. The projecting portion of the carrier 6 is in this case provided with non-illustrated short contact pins arranged to engage the printed conductor ends 4a. These short contact pins are similar to the contact pins 5 and 5a except that the contact pegs 15 are omitted. The short contact pins thus do not extend from one side of the carrier 6 to the other and simply project upwards from the carrier 6. Within the area of the grid 19, selected ones of the contact pins 5 of the carrier 6 are replaced by similar short contact pins which, however, project downwards from the carrier 6 and are arranged to engage selected ones of the contacts 13 within the area of the grid 19. The short contact pins located laterally of the grid 19 are electrically connected with those inside the area of the grid 19 internally of the carrier 6. The short contact pins may be electrically connected with one another via electrical wires or by means of a printed circuit board having connecting strips for engagement with the short contact pins. The size of the intermediate sheet 8 may here approximate that of the grid 19.

In summary, the invention provides two possibilities for engaging printed conductor ends 4a which lie outside of the area of the grid 19:

1. The intermediate sheet 8 is formed with projecting portions which extend beyond the grid 19 in the areas corresponding to those containing printed conductor ends 4a located laterally of the grid 19. Contacts 13a are provided on the projecting portions of the intermediate sheet 8 and, on the one hand, are connected with contacts 13 within the area of the grid 19 via conducting strips 20 on the intermediate sheet 8. On the other hand, the contacts 13a are connected with the printed conductor ends 4a by means of contact pins 5a which extend from one side to the other of projecting portions of the carrier 6.

2. The size of the intermediate sheet 8 corresponds to that of the grid 19 while the carrier 6 is formed with projecting portions in areas corresponding to those containing the printed conductor ends 4a. Within the area of the grid 19, the carrier 6 has downwardly projecting, short contact pins which do not extend entirely through the carrier 6. Similar, upwardly directed short pins for engaging the printed conductor ends 4a are arranged in the projecting portions of the carrier 6. The upwardly and downwardly directed short contact pins are electrically connected internally of the carrier 6.

In the two last-described embodiments of the invention, the number of grid line intersections of the grid 19, that is, the number of sockets 11 forming the grid 19, preferably approximates the largest number of printed conductor ends 4 and 4a on all of the printed circuit boards 3 to be tested with the testing arrangement 1. It is further preferred for the number of contacts 13 and 13a of the intermediate sheet 8, and especially for the number of contact pins 5 and 5a of the carrier 6, to correspond to the number of printed conductor ends 4 and 4a of the particular printed circuit board 3 being tested.

The two last-described embodiments of the invention are intended primarily for situations where a few printed conductor ends 4a located outside of the area of the grid 19 are to be contacted. However, the underlying principles may also be used to fully test large printed circuit boards which project beyond the grid 19 on all sides of the latter. Thus, as a rule, not every socket 11 of the grid 19 is connected with a printed conductor end 4 lying within the area of the grid 19. This presents the possibility of testing large printed circuit boards using a relatively small grid 19. The printed conductor ends 4a which lie outside of the area of the grid 19 are connected with locations within this area by means of the conducting strips 20 on the intermediate sheet 8 or the electrical connections internally of the carrier 6.

Figure 2:
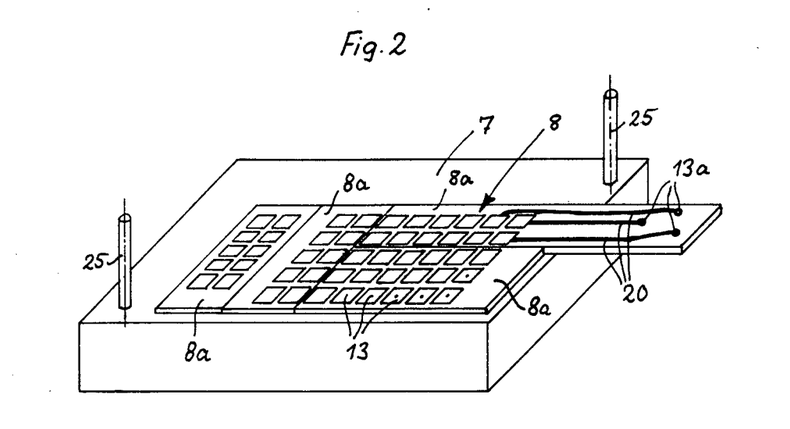
FIG. 2 is a perspective view illustrating another embodiment of an intermediate sheet in accordance with the invention.

An additional embodiment of the invention is illustrated in FIG. 2. Here, the intermediate sheet 8 is composed of several discrete sections 8a which may be individually removed from the testing arrangement 1 and replaced independently of the others. The sections 8a may be combined with one another as necessary or used individually and may be placed only at those locations within the area of the grid 19 where connections are to be established with printed conductor ends 4 and 4a. This embodiment of the invention makes it possible to assemble the testing arrangement 1 in prefabricated fashion so as to conform to the specific type of printed circuit board 3 to be tested. The positions and number of the contacts 13 and 13a of the intermediate sheet 8, as well as those of the contact pins 5 and 5a of the carrier 6, are variable and may, to a large degree, be changed as desired. The system in accordance with this embodiment of the invention makes it possible to test virtually any printed circuit board 3 having no more printed conductor ends 4 and 4a than there are sockets 11 in the grid 19. The base plate 7 with its sockets 11 is not altered when the testing arrangement 1 is converted for a different type of printed circuit board 3.

The distances between adjacent contacts 13 are advantageously selected in such a manner that the areas of the contacts 13 for a predetermined grid spacing, that is, a predetermined spacing of the grid lines, are relatively large. For instance, if the grid spacing is 2.5 millimeters, it is favorable for the distances between adjacent contacts 13 to lie approximately in the range of 0.1 to 0.4 millimeter with a separation distance of 0.2 millimeter being preferred. The areas of the contacts 13a are advantageously also relatively large. By making the areas of the contacts 13 and 13a relatively large, it becomes possible for the contacts 13 and 13a to engage corresponding contact pins 5 and 5a which are displaced somewhat from the intersections of the grid lines or from their intended positions. Thus, there are occasions where the arrangement of structural elements on the printed circuit board 3 is such that certain of the printed conductor ends 4 and 4a are shifted to some degree from the intersections of the grid lines or from their intended positions. Such printed conductor ends 4 and 4a must be engaged by contact pins 5 and 5a which are shifted accordingly. The requisite shifting of the contact pins 5 and 5a may be accommodated in a particularly favorable manner by making the contacts 13 and 13a square and positioning the contacts 13 and 13a so that the distance of separation between them is small. FIG. 4 shows a contact pin 5 which engages the center of the corresponding contact 13 as well as a contact pin 5 which engages the respective contact 13 at some distance from the center of the latter, that is, at some distance from the corresponding intersection of the grid lines.

Figure 5:
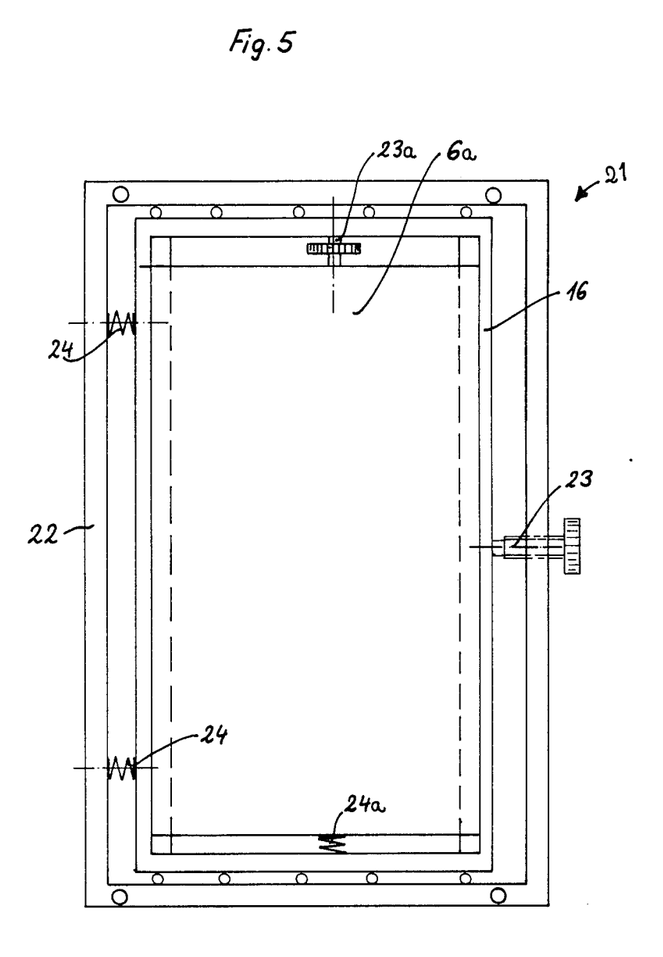
FIG. 5 is a plan view of a contact pin carrier mounted in an adjusting device.

There are occasions where the printed conductor ends 4 and 4a are displaced from the intersections of the grid lines or from their intended positions to such an extent that the corresponding contact pins 5 and 5a engage the intermediate sheet 8 between two of the contacts 13 or 13a. In accordance with another embodiment of the invention, the contact pins 5 and 5a which lie between the contacts 13 or 13a may be brought into register with the corresponding contacts 13 or 13a by shifting the carrier 6 in its plane relative to the intermediate sheet 8 and, if convenient, to the base plate 7. With reference to FIG. 5, the carrier 6 is mounted in an adjusting device which is generally identified by the reference numeral 21. The adjusting device 21 has a frame 22 which embraces the carrier 6. An adjusting element 23, e.g. a set screw, for shifting the carrier 6 transverse to its longitudinal axis is mounted on the adjusting frame 22 as are restoring elements 24 which may be in the form of springs and urge the carrier 6 back to its original position. In this embodiment of the invention, the plates 6a and 6b of the carrier 6 are mounted in the carrier frame 16 for sliding movement in longitudinal direction of the carrier 6. Adjusting elements 23a, e.g. set screws, and restoring elements 24a which may again be in the form of springs are mounted on the carrier frame 16 and serve to displace the plates 6a and 6b in longitudinal direction of the carrier 6. The adjusting elements 23 and 23a permit all of the contact pins 5 and 5a to be displaced relative to the contacts 13 and 13a so that contact pins 5 and 5a which are located between the contacts 13 or 13a may be brought into engagement with the corresponding contacts 13 or 13a. Although the required displacement of the carrier plates 6a and 6b causes those of the contact pins 5 and 5a which already engage the contacts 13 and 13a to be shifted relative thereto, the relatively large surface areas of the contacts 13 and 13a insure that these contact pins 5 and 5a do not become disengaged from the respective contacts 13 and 13a.

As mentioned previously, the intermediate sheet 8 is plugged into the base plate 7 for operation of the testing arrangement 1 by inserting the plugs 12 of the intermediate sheet 8 into the sockets 11 of the base plate 7. As a rule, this plug-in connection is sufficient to connect the intermediate sheet 8 to the base plate 7 mechanically as well as electrically. In this regard, it may be mentioned that the division of the intermediate sheet 8 into sections 8a is advantageous for removal of the intermediate sheet 8 from the base plate 7 since the forces required to individually separate the sections 8a from the base plate 7 are sufficiently small that no tools are required for the separation.

When assembling the testing arrangement 1, the carrier 6 is placed upon the intermediate sheet 8 once the latter has been connected with the base plate 7. The guide pins 25 and guide openings 26 assure that the carrier 6 and the base plate 7 and, if necessary, the intermediate sheet 8, are correctly positioned relative to one another. During operation of the testing arrangement 1, the carrier 6, the base plate 7 and the intermediate sheet 8 lie virtually flat one upon the other.

The testing arrangement 1 is mounted in a stable support. This is necessary mainly because of the large compressive forces which must be used when large numbers of contact pins are present. For example, if there are 3,000 contact pins and each requires a compressive force of 100 p, the total compressive force is 300 kp.

Without further analysis, the foregoing will so fully reveal the gist of the present invention that others can, by applying current knowlege, readily adapt it for various applications without omitting features that, from the standpoint of prior art, fairly constitute essential characteristics of the generic and specific aspects of our contribution to the art and, therefore, such adaptations should and are intended to be comprehended within the meaning and range of equivalence of the appended claims.

We claim:

1. An arrangement for testing a printed circuit board having printed conductor locations to be contacted during testing, said arrangement comprising:
    (a) a plurality of contact members each of which is arranged to engage a respective printed conductor location;
    (b) a corresponding plurality of leads for establishing electrical communication with a tester for the printed circuit board;
    (c) support means intermediate said leads and said contact members, said support means having a surface which faces said contact members, and said surface having a plurality of spaced, substantially flat contacts arranged on a grid of predetermined area and each being in electrical communication with a respective contact member, said support means being replaceable to permit conversion of said arrangement from the testing of a printed circuit board with one distribution of printed conductor locations to the testing of a printed circuit board with another distribution of printed conductor locations, and a different one of said contacts being disposed at each intersection of said grid, said contacts having respective areas which are so large that the total area of said contacts significantly exceeds 50% of said predetermined area, and the width of the gap between each pair of neighboring contacts is significantly less than one-half of the dimensions of the respective contacts as measured along a direction bridging the gap; and
    (d) a plurality of conducting elements each of which connects one of said contacts with a respective lead.

2. An arrangement as defined in claim 1, wherein at least one of said contacts comprises a foil.

3. An arrangement as defined in claim 1, wherein said contact members are pin-like.

4. An arrangement as defined in claim 1, comprising a tester for the printed circuit board.

5. An arrangement as defined in claim 1, wherein the number of said contact members substantially equals the number of locations at which the printed circuit board is contacted during testing.

6. An arrangement as defined in claim 1, wherein the number of said contacts substantially equals the number of locations at which the printed circuit board is contacted during testing.

7. An arrangement as defined in claim 1, wherein said support means comprises a plurality of individually removable supports.

8. An arrangement as defined in claim 1, wherein said support means comprises a sheet.

9. An arrangement as defined in claim 1, comprising a carrier for said contact members.

10. An arrangement as defined in claim 9, wherein said contact members are pin-like and are mounted in said carrier for movement in axial direction of said contact members.

11. An arrangement as defined in claim 9, wherein said carrier is provided with passages which receive said contact members with clearance.

12. An arrangement as defined in claim 11, wherein said carrier has an abutment surface in the region of one end of each of said passages for supporting said contact members and said contact members are removable from said carrier via the other ends of the respective passages.

13. An arrangement as defined in claim 9, wherein selected ones of said contact members are in positions which are shifted relative to predetermined positions thereof and the areas of the corresponding contacts are sufficiently large that said selected contact members are located within the respective areas.

14. An arrangement as defined in claim 13, wherein said selected contact members are inside said grid and are shifted relative to said intersections.

15. An arrangement as defined in claim 9, wherein said carrier comprises a frame member and a pair of generally parallel plates mounted in said frame member.

16. An arrangement as defined in claim 15, wherein said plates comprise an insulating material.

17. An arrangement as defined in claim 9, wherein said contact members are arranged at the intersections of said grid.

18. An arrangement as defined in claim 1, wherein said contact members include long contact members inside said grid which extend through said carrier from one side of the latter to the other and are arranged to establish electrical communication with printed conductor locations inside said grid, and short contact members outside said grid which project from said carrier towards the printed circuit board and are arranged to establish electrical communication with printed conductor locations outside said grid; and further comprising short contact elements inside said grid which project from said carrier towards said support means, said short contact elements being electrically connected with said short contact members internally of said carrier.

19. An arrangement as defined in claim 18, wherein opposite ends of each of said long contact members are aligned with one another in the direction from the printed circuit board to said support means.

20. An arrangement as defined in claim 9, wherein said carrier is plate-like.

21. An arrangement as defined in claim 20, wherein said carrier is adjustable in its plane relative to said support means.

22. An arrangement as defined in claim 20, comprising adjusting means supporting said carrier and arranged to adjust said carrier in its plane.

23. An arrangement as defined in claim 22, wherein said adjusting means comprises a frame which embraces said carrier, and an adjusting element mounted on said frame.

24. An arrangement as defined in claim 23, wherein said adjusting element comprises an adjusting screw.

25. An arrangement as defined in claim 1, wherein said contact members have first end portions arranged to engage the printed conductor locations and second end portions arranged to engage said contacts.

26. An arrangement as defined in claim 1, comprising a carrier for said contact members; and wherein the positions of said contact members on said carrier correspond to the positions of the printed conductor locations.

27. An arrangement as defined in claim 1, wherein said leads have terminal connecting portions remote from the tester for connection with said contact members and said support means is located intermediate said contact members and said terminal connecting portions.

28. An arrangement as defined in claim 1, comprising a base; and wherein said leads have terminal connecting portions remote from the tester for connection with said contact members and said terminal connecting portions are arranged in said base.

29. An arrangement as defined in claim 28, wherein said terminal connecting portions are located in a common plane.

30. An arrangement as defined in claim 28, wherein said base is plate-like.

31. An arrangement as defined in claim 28, comprising a carrier for said contact members; and wherein said carrier overlies said base.

32. An arrangement as defined in claim 28, comprising a carrier for said contact members, and guide means in said base, said carrier and said support means for correctly positioning said base, said carrier and said support means relative to one another.

33. An arrangement as defined in claim 28, wherein said base comprises receiving portions for said terminal connecting portions and said receiving portions are arranged at the intersections of said grid.

34. An arrangement as defined in claim 33, wherein said receiving portions comprise junctions for connecting said leads with said contacts.

35. An arrangement as defined in claim 33, said arrangement being adapted to accommodate a predetermined maximum number of said contact members; and wherein the number of said receiving portions approximates said maximum number.

36. An arrangement as defined in claim 33, comprising a carrier for said contact members; and wherein said carrier overlies said base and has a projecting portion which projects beyond at least one side of said grid, selected contact members being located in said projecting portion of said carrier to establish electrical communication with printed conductor locations outside of said grid.

37. An arrangement as defined in claim 33, wherein the grid spacing of said grid is substantially 2.5 mm.

38. An arrangement as defined in claim 28, comprising plug-in connections for connecting said leads with said contacts.

39. An arrangement as defined in claim 38, wherein each of said plug-in connections comprises a plug on said support means engaging a respective one of said contacts, and a junction in said base engaging a respective one of said leads and arranged to receive a respective one of said plugs.

40. An arrangement as defined in claim 39, wherein said plugs and said contacts are arranged on opposite sides of said support means.

41. An arrangement as defined in claim 39, wherein each of said plugs is arranged substantially centrally of the respective contact.

42. An arrangement as defined in claim 39, wherein said plugs are pin-like.

43. An arrangement as defined in claim 28, comprising a carrier for said contact members, and guide means in said base and said carrier for correctly positioning said base and said carrier relative to one another.

44. An arrangement as defined in claim 43, wherein said guide means comprises cooperating guide pins and openings.

45. An arrangement as defined in claim 28, comprising a plate-like carrier for said contact members; and wherein said carrier is adjustable in its plane relative to said base.

46. An arrangement as defined in claim 45, wherein said carrier is adjustable in its plane relative to said support means.

47. An arrangement as defined in claim 1, comprising additional contacts on said support means outside of said grid, and electrical conductors connecting said additional contacts with selected ones of said contacts of said grid.

48. An arrangement as defined in claim 47, wherein said electrical conductors comprise printed conductors.

49. An arrangement as defined in claim 1, wherein each of said contact members comprises a hollow body having opposite ends, a telescoping member projecting through one of said ends, biasing means in said hollow body urging said telescoping member outwards, and a contact peg secured to the other of said ends externally of said hollow body.

50. An arrangement as defined in claim 49, comprising a contact tip on each of said telescoping members.

51. An arrangement as defined in claim 1, wherein the distance between adjacent ones of said contacts is approximately 0.1 to 0.4 mm.

52. An arrangement as defined in claim 51, wherein said distance is substantially 0.2 mm.

* * * * *